United States Patent
Mattern et al.

(10) Patent No.: US 8,352,817 B2
(45) Date of Patent: Jan. 8, 2013

(54) METHOD FOR TESTING A MEMORY DEVICE, AS WELL AS A CONTROL DEVICE HAVING MEANS FOR TESTING A MEMORY

(75) Inventors: Klaus-Peter Mattern, Beilstein (DE); Carsten Gebauer, Boeblingen (DE); Harald Tschentscher, Grossbottwar (DE)

(73) Assignee: Robert Bosch GmbH, Stuttgart (DE)

( * ) Notice: Subject to any disclaimer, the term of this patent is extended or adjusted under 35 U.S.C. 154(b) by 288 days.

(21) Appl. No.: 12/726,058

(22) Filed: Mar. 17, 2010

(65) Prior Publication Data
US 2010/0287425 A1    Nov. 11, 2010

(30) Foreign Application Priority Data
May 4, 2009   (DE) .......................... 10 2009 002 786

(51) Int. Cl.
*G01R 31/28* (2006.01)
(52) U.S. Cl. .................. 714/732; 714/738; 714/718
(58) Field of Classification Search .................. 714/718, 714/719, 732, 738
See application file for complete search history.

(56) References Cited

U.S. PATENT DOCUMENTS

| | | | | |
|---|---|---|---|---|
| 5,311,476 | A * | 5/1994 | Kajimoto et al. | 365/222 |
| 5,384,784 | A * | 1/1995 | Mori et al. | 714/718 |
| 6,550,032 | B1 * | 4/2003 | Zhao et al. | 714/730 |
| 6,779,141 | B1 * | 8/2004 | Pendurkar | 714/719 |

* cited by examiner

*Primary Examiner* — M. Mujtaba K Chaudry
(74) *Attorney, Agent, or Firm* — Kenyon & Kenyon LLP

(57) ABSTRACT

A method for testing a memory and a control device having means for a memory test. A destination address of the memory is selected in the process, dependent addresses of the memory are determined from the destination address, and user data at the destination address and the dependent addresses are backed up. Furthermore, the destination address and the dependent addresses are described by test patterns, via which a signature is formed. The backed-up user data of the destination address and the dependent addresses are then restored. Finally, the determined signature is compared with the known setpoint value. In the event of a deviation between the signature and the setpoint value, suitable protective mechanisms are initiated.

9 Claims, 2 Drawing Sheets

METHOD FOR TESTING A MEMORY DEVICE, AS WELL AS A CONTROL DEVICE HAVING MEANS FOR TESTING A MEMORY

BACKGROUND INFORMATION

Test algorithms for detecting error functions (e.g., stuck at, transition, delay, linking errors, etc.) inside memory units are described in the related art, for example U.S. Pat. No. 6,779,141.

SUMMARY OF THE INVENTION

The present invention relates to a method for testing a memory and to a control device which includes means for testing a memory. Dependent addresses are selected from a destination address, the destination address and the dependent addresses are described with test patterns and checked in this manner. The memory test according to the present invention is characterized by especially high flexibility because it checks not only the destination address but also the individual dependent addresses that are linked to the destination address via common error sources, for instance because of virtually identical addresses or physical proximity to the destination address. The memory test according to the present invention is also characterized in that it is able to run in the background and in that it tests with high efficiency both the memory unit itself and also the correct method of functioning of the units (buses, address decoders, etc.) involved in the accesses; in other words, it provides high test coverage while having a low run time requirement as well as short interrupt blocking phases.

In one advantageous development, the destination address is selected according to a specified sequence, in such a way that the method tests all addresses of the memory sequentially. This ensures that, following a specific number of steps of the method or following a specific period of time, the entire memory has been tested with the aid of the method according to the present invention.

It may also be advantageous to select the destination address in an event-controlled manner, the event being the determination of an error at the destination address by an additional memory testing method. In this advantageous development the method according to the present invention may therefore be used for testing a destination address that was suspicious in another memory-testing method, and, moreover, for checking dependent addresses of the destination address as well. In this development the memory test according to the present invention therefore constitutes a supplement to the existing memory testing method and therefore increases the reliability of the overall system.

In one additional advantageous development, the selection of the destination address takes place according to a specified sequence, in such a manner that the method is employed for testing all addresses of the memory in sequential order, it being possible for the specified sequence to be interrupted by an event, such an event being an error in the destination address that was detected by an additional memory testing method. This specific embodiment combines the advantages of a testing method that tests the entire memory, with the advantages of a testing method that is able to be used in a flexible manner, as a supplement to an existing testing method for the purpose of checking problematic or suspicious destination addresses as well as the associated dependent addresses. Overall, this results in considerably higher security for the entire memory.

One specific embodiment, in which the memory test according to the present invention supplements an ECC (error correction code) method, is especially advantageous. While memory protections according to an ECC method reliably detect and correct 1-bit errors, problems may arise when, for instance, an ECC method detects a multi-bit error as a 1-bit error. To safeguard against such a case, it is advantageous to supplement the ECC method by a memory test according to the present invention, which, in addition to checking the destination address, checks dependent addresses as well. In an advantageous manner the memory test according to the present invention is used for destination addresses for which the ECC method has detected and corrected an error.

In one expedient embodiment, in the event that a dependent address that does not physically exist has been determined, the dependent address will be replaced by an alternate address. This advantageously ensures that the fact that a portion of the determined dependent addresses does not exist at all and a utilization/evaluation of the test pattern provided for these dependent addresses is unable to be implemented, does not result in faulty results in the check of the test patterns.

In order to use the test according to the present invention to test addresses that are linked to the destination address by a faulty address allocation, e.g., by faulty address decoders or a faulty bus system, it is especially useful to determine the dependent addresses by bit inversion of individual or multiple bits from the destination address. In this way the addresses that differ the least from the destination address with regard to the address and which therefore constitute the probable addresses that are affected by faulty addressing of the destination address are determined from the destination address.

Additionally or alternatively to this determination of the dependent addresses, it may also be advantageous to determine the dependent addresses from layout information about a physical proximity to the destination address. The probability that these physically adjacent addresses are linked to the destination address via memory errors is especially high, which is why they are particularly predestined for a more thorough check.

DETAILED DESCRIPTION

Figure 1:
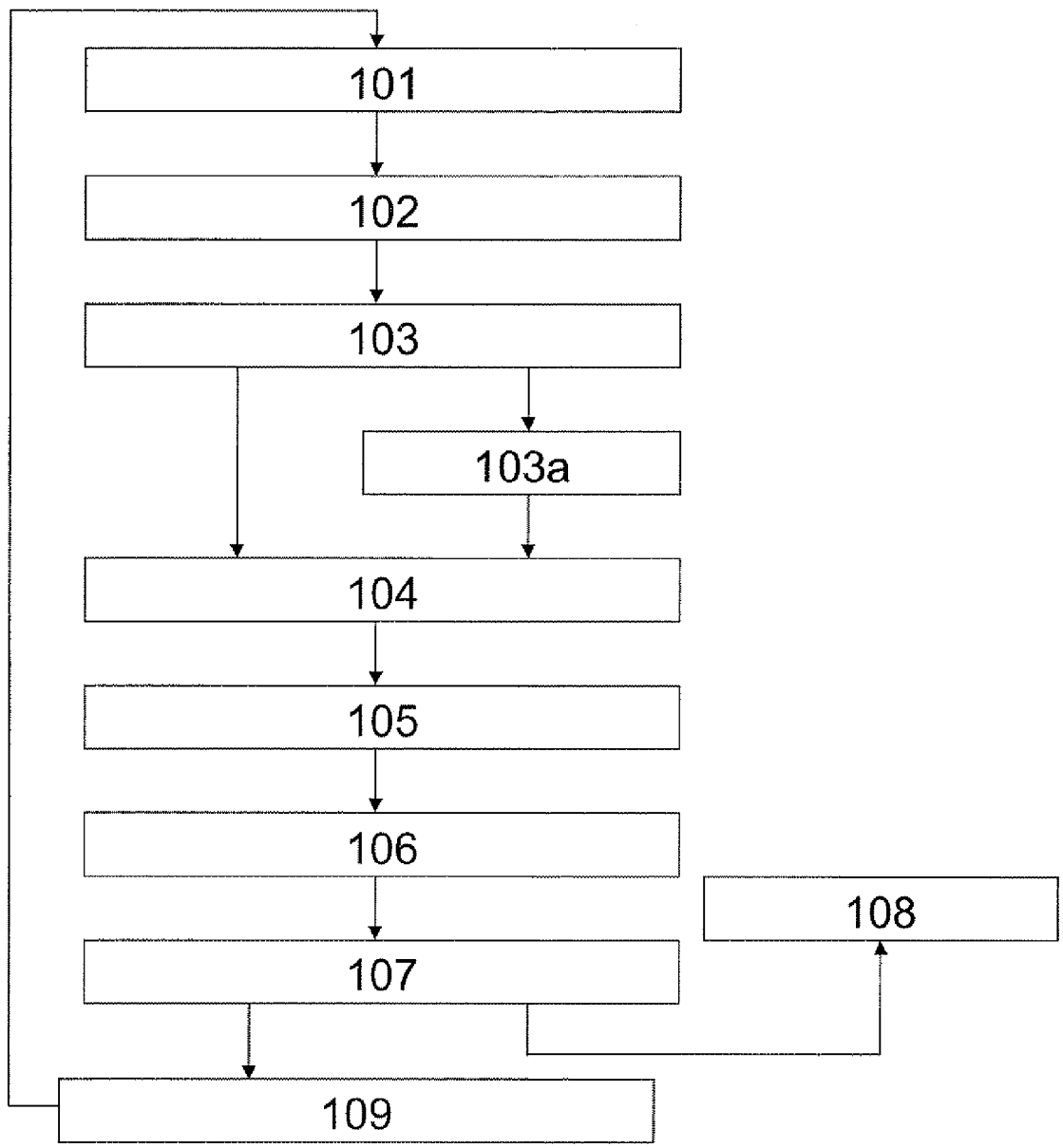
FIG. 1 shows an exemplary sequence of a method according to the present invention.

FIG. 1 shows an exemplary sequence of a method according to the present invention, the method encompassing steps 101 through 109. In a first step, destination address 101 is selected, whereupon dependent addresses 102 are determined. Then, a test for the physical existence of dependent addresses 103 is provided. If appropriate, this is followed by a selection of alternate addresses 103a for non-existent dependent addresses. In next step 104, the user data are backed up or buffer-stored. Then the destination addresses and the dependent addresses are described with test patterns 105. In step 106, a signature is formed via these test patterns, which is compared with a setpoint value in following step 107. Depending on the result of the comparison with the setpoint value, a protective mechanism is initiated in step 108 in case the signature does not match the setpoint value, or else the user data are restored in step 109 in case the signature agrees with the setpoint value. As shown in FIG. 1, the method according to the present invention ends in step 108 if the check of the signature is negative; for example, the memory is switched to a fail-safe mode, if the check has been successful or if the comparison of the signature with the setpoint value has been successful, then steps 101 through 108 or 109 are run through again once the user data has been backed up in step 109.

The following text provides a detailed description of the individual steps of the sequence of the test method according to the present invention introduced in FIG. 1. Step 101, the selection of the destination address, may be implemented according to specific methods. On the one hand, it is certainly advantageous if the destination address is selected in such a way that all addresses of the memory are tested one after the other using the method of the present invention. As an alternative but also in addition, the destination address may be selected in response to a specific event. For example, if the method according to the present invention is combined with another memory testing method, it may happen that the other memory testing method had detected an error in a specific address, so that it may be advantageous to select this address as the next destination address and to check it further.

In second step 102, the determination of the dependent addresses, additional addresses to be subjected to the following testing steps are determined based on the destination address. The determination of the dependent addresses may be carried out according to specific criteria or according to specific algorithms. It is useful to determine dependent addresses for which there is an increased likelihood of being linked to the destination address via common memory errors. For example, one option includes selecting as dependent addresses the particular addresses that differ only slightly from the destination address, e.g., by individual bits. This may be accomplished by deriving the dependent addresses through individual bit inversion or the inversion of a few bits, from the destination address. Alternatively or additionally, it also seems useful to determine the dependent addresses from layout information regarding the memory; above all, it is useful to select as dependent address addresses in the physical proximity of the destination address. The selection of dependent addresses from the destination address introduced here is accompanied by frequent and known error sources in memories. For example, an error in the memory decoder may lead to faulty addressing of a message by one bit, which may cause a completely wrong data word to be stored in the incorrectly addressed address. Due to errors in the physical storage, it is also possible that a data word is not stored in the intended destination address but in an address in its physical proximity. In the design of the test, all components involved in the storage, such as the storage locations themselves, address decoders, write/read amplifiers and bus links, may be taken into account. These introduced components are frequent sources of errors in the storage of data words, especially for multi-bit errors, which may possibly not be detected, or detected incorrectly, by common methods such as ECC (error correction code) or EDC (error detection code). For this reason, the introduced testing method is also especially suitable as supplementation of common data securing mechanisms, such as ECC methods, for example.

In step 102, the determination of the dependent addresses, it is also possible, for instance, to combine a plurality of algorithms or methods for determining the dependent addresses; for example, the dependent addresses may encompass both the sub-quantity of the addresses determined by bit inversion from the destination address, and also the sub-quantity of the addresses from the physical proximity to the destination address.

If the dependent addresses are determined from the destination address with the aid of an algorithm, e.g., by bit inversion from the destination address, then it may happen that the dependent addresses do not even physically exist. Since the consistent application of the test patterns is not possible in such a case or would lead to a faulty result, it is necessary to check the physical existence of the dependent addresses. This is provided in step 103. In the event that all dependent addresses do indeed physically exist, the method according to the present invention continues with step 104. In the event that one or individual or multiple dependent addresses does/do not exist, each of these physically non-existent dependent addresses is replaced by an alternate address in the further course. The selection of the alternate addresses is provided in step 103a. There are alternate procedures for selecting the alternate addresses; for example, the alternate addresses may alternatively be selected either from a memory area specifically reserved for this purpose, or addresses are determined as alternate addresses from the entire available memory to be tested, which addresses are neither selected as destination address just then nor are they selected as dependent address just then. The former selection method has the advantage of well-defined alternate addresses and a simplified selection method for the alternate addresses; the latter method saves the setup of a memory area specifically reserved for this purpose.

The following portion of the memory test must be running exclusively (interrupt block) in order to ensure the data consistency for the application. Before it is possible to describe the destination address and the dependent address with test patterns in a further step, the user data stored in the destination address and the dependent addresses must be backed up. This is done in step 104 by, for example, buffer-storing the user data in a memory provided for this purpose or in a memory region of the tested memory provided for this purpose. Once the user data have been backed up in step 104, the destination address and the dependent address are described with test patterns in step 105. The related art describes a variety of methods for generating especially advantageous test patterns, which are characterized by a particular depth of testing. The method according to the present invention allows the use of standard test patterns from the related art. It is also conceivable that the test patterns that are written into the destination address and the dependent addresses in this step 105 are adapted to the selection of the dependent addresses in step 102. Especially advantageous are test patterns that offer a high potential for also uncovering, in particular, multi-bit errors and linking errors in the region of the write/read amplifiers and bus links.

In the following steps 106 and 107, a signature is formed via the test patterns written into the destination address and the dependent addresses, and this signature is compared with a stored setpoint value. Depending on the result of the comparison of the signature with the setpoint value, two alternative method steps are provided as described above. If the signature formed via the test patterns agrees with the setpoint value, then the user data that have been buffer-stored or backed up in step 104 are restored, and the method according to the present invention is continued with step 101, the selection of a new destination address. However, if the signature via the test patterns does not agree with the setpoint value, then corresponding protective mechanisms are initiated in step 108. For example, a protective mechanism may provide that the unsuccessful comparison of the signature with the setpoint value is output in the form of an error message. Furthermore, the memory may also be switched into a fail-safe mode, for instance, once a faulty signature has been detected. The latter method may be necessary for security reasons for safety-critical applications, in particular. In contrast to FIG. 1, in which steps 108 and 109 are shown as an alternative, steps 108 and 109 may also run in parallel. For example, in case of a negative comparison between signature and setpoint value, it is conceivable that the user data are restored nevertheless and protective mechanisms are initiated in parallel therewith. If appropriate, it is also possible to start the method of the present invention with step 101 again, parallel to the initiation of the protective mechanisms, for example if the security specifications are less rigorous.

Furthermore, it may be advantageous, in particular for real-time systems, to restore the user data according to block 109 directly following the determination of the signature of the test patterns in order to keep the interrupt blocking time as short as possible in this way. In this variant the setpoint/actual comparison of the signature according to block 107 then takes place once the interrupt block has been canceled.

As mentioned earlier, in one especially advantageous variant the switching through of the address of the memory location (destination address) being tested takes place continuously across the entire address space of the available data memory, more or less rapidly as a function of the overall safety-related concept and the CPU resources available for this testing. Thus, the selection of the destination address is implemented according to a specified sequence, such that the method is used for testing all addresses of the memory one after the other. As an alternative, other sequences are conceivable as well, in which, for example, specific memory areas are taken into special consideration, which are then tested more often, for instance.

As also mentioned earlier, one special development provides the basic possibility, e.g., via a corresponding interface, to perform the test if a suspicious item is found, e.g., a single bit soft error detected in a hardware-supported manner (e.g., by ECC), the test being performed directly for this conspicuous memory location in order to switch the entire system into a safe system state as quickly as possible in the event of a possible static hardware defect. In this context, it may alternatively be provided that, as described above, the method in a "normal" mode goes through all the addresses of the memory to be tested and interrupts this process only in the event of such a conspicuousness, or that the method is basically used only for such suspicious cases. This alternative combines the advantages of the method according to the present invention with the advantages of an additional, second testing method, e.g., ECC, and thus provides increased security.

Figure 2:
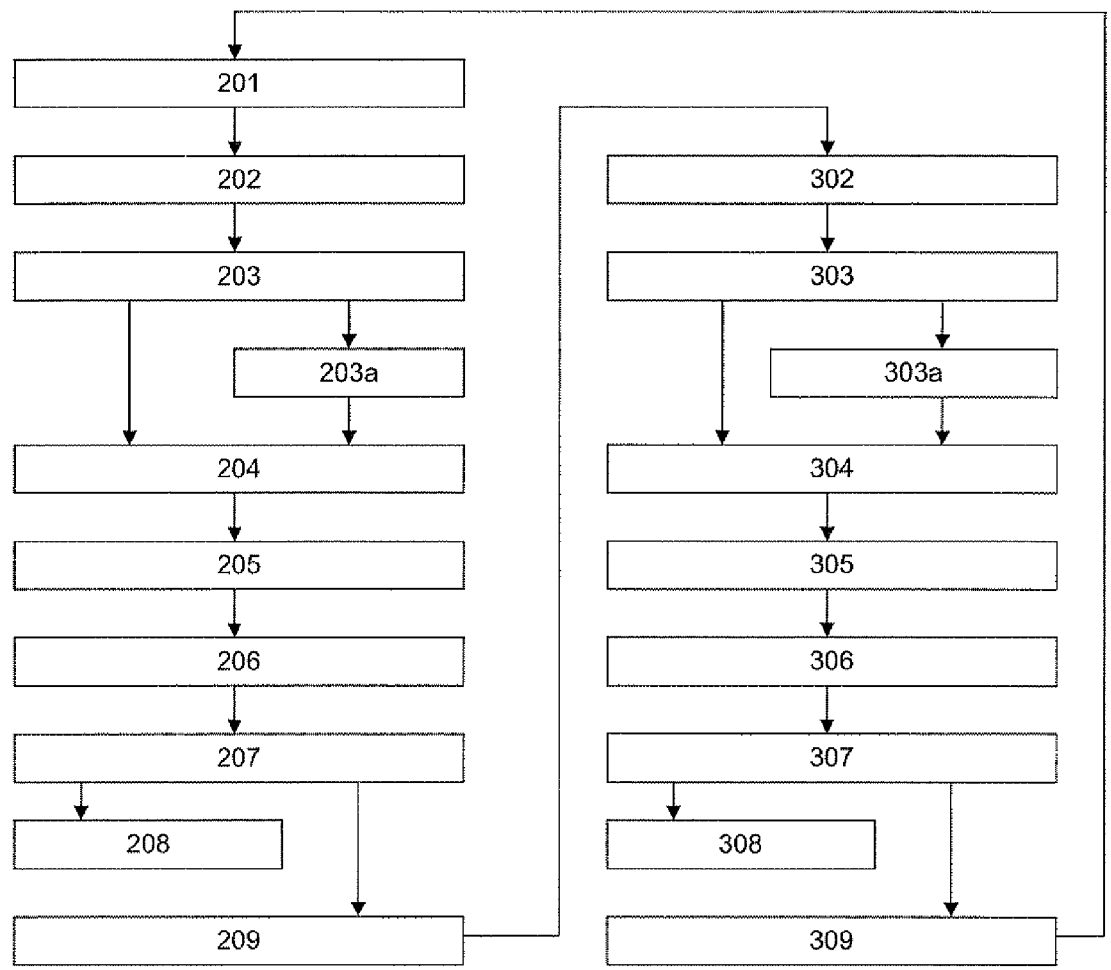
FIG. 2 shows an exemplary sequence of a combined method according to the present invention.

FIG. 2 shows an exemplary sequence of a combined method according to the present invention. The reference numerals bearing matching last two numbers denote identical method steps. The individual method steps shown in FIG. 2 therefore correspond to method steps 101 through 109 explained in detail in FIG. 1. In the combined method shown in FIG. 2, the memory test is run through by the additional method steps 202 through 207, analogously to FIG. 1, following the selection of destination address 201. The comparison of the signature, formed via the test patterns, with the setpoint value in step 207 is in turn followed by alternative method steps 208, initiation of a protective mechanism, and 209, restoration of the user data. In a deviation from the method illustrated in FIG. 1, in the combination method shown in FIG. 2 no new destination address is selected following the restoration of the user data in step 209; instead the method according to the present invention is implemented one more time, by steps 302 through 308 or 309, for the destination address selected in step 201. Only following a successful comparison, which takes place between the signature and the setpoint value in 307, will a new destination address be selected in step 201 once the user data has been restored in step 309. Such a sequence of the method steps may be advantageous in particular if in steps 202 and 302 different dependent addresses are determined from the same destination address using different methods or different algorithms. As described above, a coordinated selection of the test patterns used in steps 205 and 305 may take place in parallel with the different method for selecting the dependent addresses from the destination address. Such a combined method makes it possible, for example, to check the dependent addresses determined by bit inversion from the destination address in a first test run-through of 201 to 209, and in the further method steps 302 to 309 to check the dependent addresses resulting from the physical proximity to the destination address.

The combined testing method shown in FIG. 2 is merely of exemplary nature and variable in different ways. For example, step 209 may be skipped in an alternative specific embodiment, and the user data be provided only following a successful run-through of both method branches. In a variation, it is also possible to provide for the run-through not only of two method branches—in this case, 201 through 209, and 302 through 309—but of additional method branches for each selected destination address. Another option is the variant mentioned earlier already, of combining different selection methods or algorithms for selecting the dependent addresses in a common step 102 or 202 and 302.

What is claimed is:

1. A method for testing a memory, comprising:
    selecting a destination address of the memory, the destination address corresponding to a location of a data word in the memory;
    determining dependent addresses of the memory from the destination address, each dependent address corresponding to a location of an additional data word in the memory;
    buffer-storing user data of the destination address and the dependent addresses in other memory areas;
    after performing the buffer-storing, writing test patterns into the destination address and the dependent addresses, the test patterns including data different from the user data;
    reading the test patterns of the destination address and the dependent addresses out of the memory;
    forming a signature based on a combination of the test patterns that have been read from the memory;
    comparing the signature with a setpoint value; and
    initiating protective mechanisms if there is a deviation between the signature and the setpoint value.

2. The method according to claim 1, wherein the selection of the destination address is carried out in such a way that all addresses of the memory are sequentially tested by the method.

3. The method according to claim 1, wherein the destination address is selected based on a previous determination of an error at the same destination address by an additional memory-testing method.

4. The method according to claim 1, wherein the selection of the destination address is performed in such a way that all addresses of the memory are tested sequentially by the method, the selection being capable of being interrupted in response to a determination of an error in the memory by an additional memory-testing method.

5. The method according to claim 3, wherein the additional memory-testing method is an ECC (error correction code) method.

6. The method according to claim 1, further comprising:
after determining each dependent address, determining whether the dependent address physically exists in the memory; and
responsive to determining that the dependent address does not physically exist, replacing the dependent address with an alternative address.

7. The method according to claim 1, wherein the dependent addresses are determined by bit inversion of individual or multiple bits from the destination address.

8. The method according to claim 1, wherein the dependent addresses are determined from layout information about a physical proximity to the destination address, and the dependent addresses are selected to be physically close to the destination address.

9. A control device for memory testing, the control device comprising:
a memory device; and
a processor that is configured to:
select a destination address of the memory device, the destination address corresponding to the location of a data word in the memory device;
determine dependent addresses of the memory device from the destination address, each dependent address corresponding to the location of an additional data word in the memory device;
buffer storing buffer-store in the memory device user data of the destination address and the dependent addresses in other memory areas;
after performing the buffer-storing, write test patterns into the destination address and the dependent addresses, the test patterns including data different from the user data;
read the test patterns of the destination address and the dependent addresses out of the memory device;
form a signature based on a combination of the test patterns that have been read from the memory device;
compare the signature with a setpoint value;
initiate protective mechanisms in the event of a deviation between the signature and the setpoint value; and
restore the user data of the destination address and the dependent addresses, by rewriting the user data to their respective address locations, if there is a match between the signature and the setpoint value.

* * * * *